United States Patent
Wang et al.

(10) Patent No.: US 9,898,123 B2
(45) Date of Patent: Feb. 20, 2018

(54) SENSING DEVICE

(71) Applicant: Nuvoton Technology Corporation, Hsinchu (TW)

(72) Inventors: Cheng-Chih Wang, Hsinchu (TW); Chih-Ping Lu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 647 days.

(21) Appl. No.: 14/289,667

(22) Filed: May 29, 2014

(65) Prior Publication Data

US 2015/0062074 A1 Mar. 5, 2015

(30) Foreign Application Priority Data

Sep. 3, 2013 (TW) .............................. 102131728 A (51) Int. Cl.
*G06F 3/044* (2006.01)
*G06F 3/041* (2006.01)
*H03K 17/96* (2006.01)

(52) U.S. Cl.
CPC ............ *G06F 3/0416* (2013.01); *G06F 3/044* (2013.01); *H03K 17/9622* (2013.01); *H03K 2217/94026* (2013.01); *H03K 2217/960715* (2013.01)

(58) Field of Classification Search
CPC .... G06F 3/044; H03K 17/962; H03K 17/955; G01D 5/24
See application file for complete search history.

(56) References Cited

U.S. PATENT DOCUMENTS

| 8,441,462 B2 | 5/2013 | Kobayashi et al. |
| 2007/0268272 A1* | 11/2007 | Perski ...................... G06F 3/044 345/173 |
| 2011/0122089 A1* | 5/2011 | Kobayashi .............. G06F 3/044 345/174 |
| 2014/0049510 A1* | 2/2014 | Chung .................. G06F 3/0416 345/174 |

FOREIGN PATENT DOCUMENTS

| CN | 101908876 A | 12/2010 |
| TW | 201141301 A | 11/2011 |
| TW | 201329829 A | 7/2013 |
| WO | 2009090534 A2 | 7/2009 |
| WO | 2013069290 A1 | 5/2013 |

* cited by examiner

*Primary Examiner* — William Boddie
*Assistant Examiner* — Jeffrey A Parker
(74) *Attorney, Agent, or Firm* — CKC & Partners Co., Ltd.

(57) ABSTRACT

A sensing device includes a comparator, a first and a second variable capacitor unit. A first comparator input of the comparator is electrically coupled to a touch pad. The first variable capacitor unit is configured to charge the first comparator input such that the first comparator input has a first potential. The second variable capacitor unit is configured to charge a second comparator input of the comparator such that the second comparator input has a second potential. The comparator is configured for comparing the first potential and the second potential to generate a comparator output signal. In a condition of the touch pad being operated, the first variable capacitor unit is adjusted according to the comparator output signal to perform potential compensation for the first comparator input, or the second variable capacitor unit is adjusted according to the comparator output signal to perform potential compensation for the second comparator input.

15 Claims, 9 Drawing Sheets

SENSING DEVICE

RELATED APPLICATIONS

This application claims priority to Taiwanese Patent Application Serial Number 102131728, filed Sep. 3, 2013, which is herein incorporated by reference.

BACKGROUND

Technical Field

The present disclosure relates to an electronic device. More particularly, the embodiments of present disclosure relates to a sensing device for sensing operations of touch pads.

Description of Related Art

For high technology nowadays, user interfaces of more and more electronic products have already employed touch panels, such that demands for touch sensing devices have increasingly matured. Touch sensing devices have already become the basis of any kind of user interface, and replacing traditional keyboard interface with touch sensing interface undoubtedly makes the user interface become more intuitional and easier for use.

Moreover, one of ordinary skill in the art can use the touch sensing interface to substitute mechanical keys necessary in various applications such as access control, mobile phone, MP3 player, personal computer peripherals, remote controller, etc., and costs for manufacturing products can thus be saved.

However, for example, in a capacitive touch sensing device, it usually requires a lot of capacitors for the touch sensing operation, and circuit layout areas occupied by the capacitors are quite large, such that the size of the touch sensing device cannot be reduced effectively and the cost for manufacturing the touch sensing device is kept high.

In addition, for a conventional touch sensing device, once the circuit layout of the capacitors is determined, the sensitivity of the touch sensing device is fixed and cannot be changed. As a result, the touch sensing operation performed by the touch sensing device cannot be flexibly adjusted according to practical conditions or user's needs.

SUMMARY

An embodiment of the present disclosure is related to a sensing device. The sensing device includes a comparator, a first variable capacitor unit and a second variable capacitor unit. The comparator includes a first comparator input and a second comparator input, and the first comparator input is configured to be electrically coupled to a first touch pad. The first variable capacitor unit is electrically coupled to the first comparator input, and is configured to charge the first comparator input with at least one first driving signal, such that the first comparator input has a first potential. The second variable capacitor unit is electrically coupled to the second comparator input, and is configured to charge the second comparator input with at least one second driving signal, such that the second comparator input has a second potential. The comparator is configured to compare the first potential with the second potential to generate a comparator output signal. In a condition of the first touch pad being operated, the first variable capacitor unit is adjusted according to the comparator output signal to perform potential compensation for the first comparator input, or the second variable capacitor unit is adjusted according to the comparator output signal to perform potential compensation for the second comparator input.

Another aspect of the present disclosure is related to a sensing device. The sensing device includes a comparator and a variable capacitor unit. The comparator includes a first comparator input and a second comparator input. The first comparator input is configured to be electrically coupled to a touch pad, and the second comparator input is configured to be electrically coupled to a reference voltage source to have a reference potential. The variable capacitor unit is electrically coupled to the first comparator input, and is configured to charge the first comparator input with at least one first driving signal, such that the first comparator input has a first potential, in which the comparator is configured to compare the first potential with the reference potential to generate a comparator output signal. In a condition of the touch pad being operated, the variable capacitor unit is adjusted according to the comparator output signal to perform potential compensation for the first comparator input.

Still another aspect of the present disclosure is related to a sensing device. The sensing device includes a comparator, a first switch, a second switch and a controller. The comparator includes a first comparator input and a second comparator input. The first comparator input has a first potential and is configured to be electrically coupled to a touch pad. The second comparator input has a second potential, in which the comparator is configured to compare the first potential with the second potential to generate a comparator output signal. The first switch is configured to selectively couple the first comparator input to a series of touch pads in a plurality of series of touch pads. The series of touch pads comprises the touch pad. The second switch is configured to selectively transmit at least one first driving signal to the touch pad in the series of touch pads. The controller is configured to receive the comparator output signal. In a condition of the touch pad being operated, the controller is configured to adjust the first potential according to the comparator output signal.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, "around", "about", "approximately" or "substantially" shall generally mean within 20 percent (or other approximate values), preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

Figure 1:
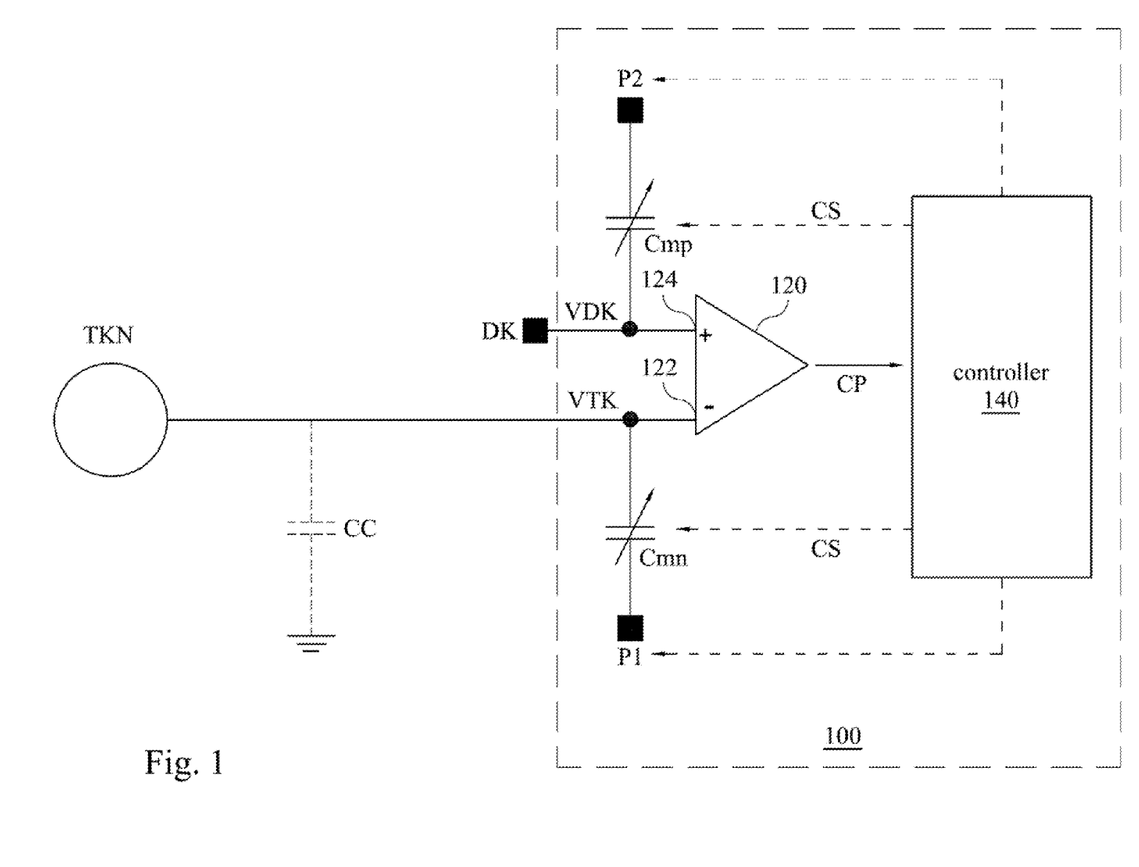
FIG. 1 is a schematic diagram of a sensing device according to a first embodiment of the present disclosure.

FIG. 1 is a schematic diagram of a sensing device according to a first embodiment of the present disclosure. As illustrated in FIG. 1, the sensing device 100 can be configured to sense operations of at least one touch pad (e.g., a capacitive touch pad TKN) and to correspondingly operate (e.g., control sequential circuits, output digital data signals, etc.) according to the sensing result, so as to perform corresponding functions or operations. The sensing device 100 includes a comparator 120, a variable capacitor unit Cmn and a variable capacitor unit Cmp. The comparator 120 includes a first comparator input 122 and a second comparator input 124, and the first comparator input 122 can be configured to be electrically coupled to the capacitive touch pad TKN. The variable capacitor unit Cmn is electrically coupled to the first comparator input 122 and is configured to charge the first comparator input 122 with at least one first driving signal (e.g., a driving signal P1), such that the first comparator input 122 has a first potential VTK. The variable capacitor unit Cmp is electrically coupled to the second comparator input 124 and is configured to charge the second comparator input 124 with at least one second driving signal (e.g., a driving signal P2), such that the second comparator input 124 has a second potential VDK, in which the comparator 120 can be configured to compare the first potential VTK with the second potential VDK to generate a comparator output signal CP.

In a condition of the capacitive touch pad TKN being operated (e.g., the capacitive touch pad TKN is touched by a finger, a touch pen, etc., to have capacitance variations), the first potential VTK of the capacitive touch pad TKN is lower than the second potential VDK. The variable capacitor unit Cmn is adjusted, according to the comparator output signal CP generated by comparing the first potential VTK with the second potential VDK, to perform potential compensation for the first comparator input 122, such that the first potential VTK is equal to or balanced with the second potential VDK after the potential compensation, so as to acquire potential or capacitance variations corresponding to the operations of the capacitive touch pad TKN, for sequential data processing, in order to determine if a touch operation occurs or a corresponding touch function is performed.

In some embodiments, the first comparator input 122 is a positive polarity input (i.e., the input "+") of the comparator 120, and the second comparator input 124 is a negative polarity input (i.e., the input "−") of the comparator 120. In some other embodiments, the first comparator input 122 is the negative polarity input (i.e., the input "−") of the comparator 120, and the second comparator input 124 is the positive polarity input (i.e., the input "+") of the comparator 120.

Figure 2A:
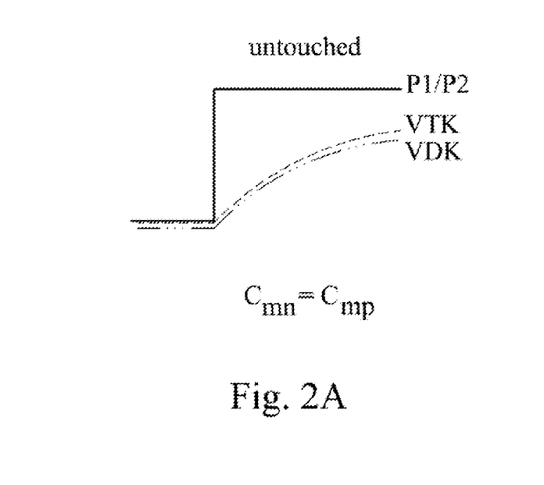
FIGS. 2A-2C are schematic diagrams of capacitance and potential variations in the sensing device shown in FIG. 1, according to one embodiment of the present disclosure.
Figure 2B:
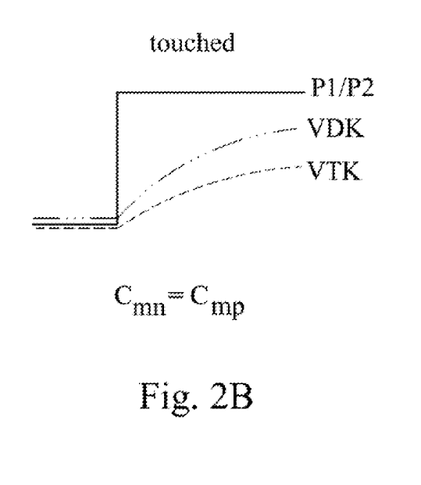
Figure 2C:
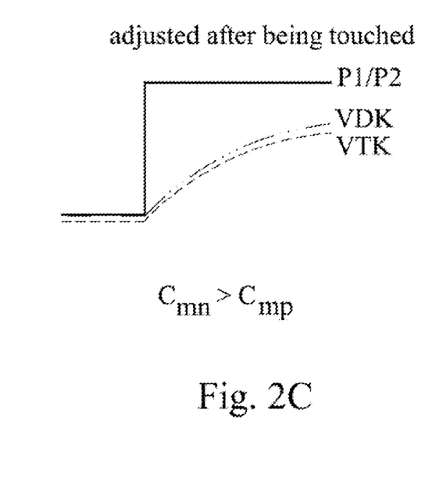

FIGS. 2A-2C are schematic diagrams of capacitance and potential variations in the sensing device shown in FIG. 1, according to one embodiment of the present disclosure. Specifically, as illustrated in FIG. 1 and FIGS. 2A-2C, for example that the variable capacitor units Cmn and Cmp have the same predetermined equivalent capacitance, in the condition of the capacitive touch pad TKN being not operated (e.g., the capacitive touch pad TKN is not touched), the first potential VTK and the second potential VDK can be charged through the variable capacitor units Cmn and Cmp, respectively, to be identical or close to each other. Then, in the condition of the capacitive touch pad TKN being operated (e.g., the capacitive touch pad TKN is touched by a finger, a touch pen, etc.), the capacitance (e.g., a self capacitance CC) of the terminal where the capacitive touch pad TKN is coupled to the first comparator input 122 has a variation, such that the first potential VTK is decreased to be lower than the second potential VDK. Moreover, the variable capacitor unit Cmn can be adjusted according to the comparator output signal CP generated by comparing the first potential VTK with the second potential VDK (e.g., the variable capacitor unit Cmn may have an equivalent capacitance larger than that of the variable capacitor unit Cmp after the variable capacitor unit Cmn is adjusted), to perform potential compensation for the first comparator input 122, such that the first potential VTK is increased again to be identical or close to the second potential VDK. The corresponding potential or capacitance variation mentioned above can be provided for sequential data processing, in order to determine if a touch operation occurs or to perform a corresponding touch function.

In other embodiments, the variable capacitor unit Cmp can be adjusted according to the comparator output signal CP generated by comparing the first potential VTK with the second potential VDK (e.g., the variable capacitor unit Cmp may have an equivalent capacitance smaller than that of the variable capacitor unit Cmn after the variable capacitor unit Cmp is adjusted), to perform potential compensation for the second comparator input 124, such that the second potential VDK is decreased to be identical or close to the first potential VTK.

In various embodiments, the variable capacitor units Cmp and Cmn can be respectively adjusted according to the comparator output signal CP generated by comparing the first potential VTK with the second potential VDK, to perform potential compensation for the first comparator input 122 and the second comparator input 124, such that the second potential VDK and the first potential VTK are identical or close to each other after the potential compensation.

The aforementioned operations of adjusting the variable capacitor units Cmp and Cmn according to the comparator output signal CP can be performed at the same time, or one (e.g., the variable capacitor unit Cmp) is adjusted and the other (e.g., the variable capacitor unit Cmn) is then adjusted, or opposite operations are performed in which the variable capacitor unit Cmn is adjusted and the variable capacitor unit Cmp is then adjusted. In some embodiments of the present disclosure, "potential compensation" indicates increasing the potential of the comparator input and also indicates decreasing the potential of the comparator input; in other words, the potential of the comparator input can be compensated to increase or decrease.

Furthermore, as illustrated in FIG. 1, the sensing device 100 can further include a controller 140, and the controller 140 is electrically coupled to the comparator 120 and configured to receive the comparator output signal CP to generate a control signal CS for controlling the variable capacitor unit Cmn, to adjust the equivalent capacitance of the variable capacitor unit Cmn, such that the variable capacitor unit Cmn can correspondingly perform potential compensation for the first comparator input 122. In other embodiments, the equivalent capacitance of the variable capacitor unit Cmp can be adjusted, such that the variable capacitor unit Cmp can correspondingly perform potential compensation for the second comparator input 124. Alternatively, as mentioned above, the equivalent capacitances of the variable capacitor units Cmp and Cmn can be respectively adjusted, such that the variable capacitor units Cmp and Cmn can correspondingly perform potential compensation for the second comparator input 124 and the first comparator input 122.

Figure 3:
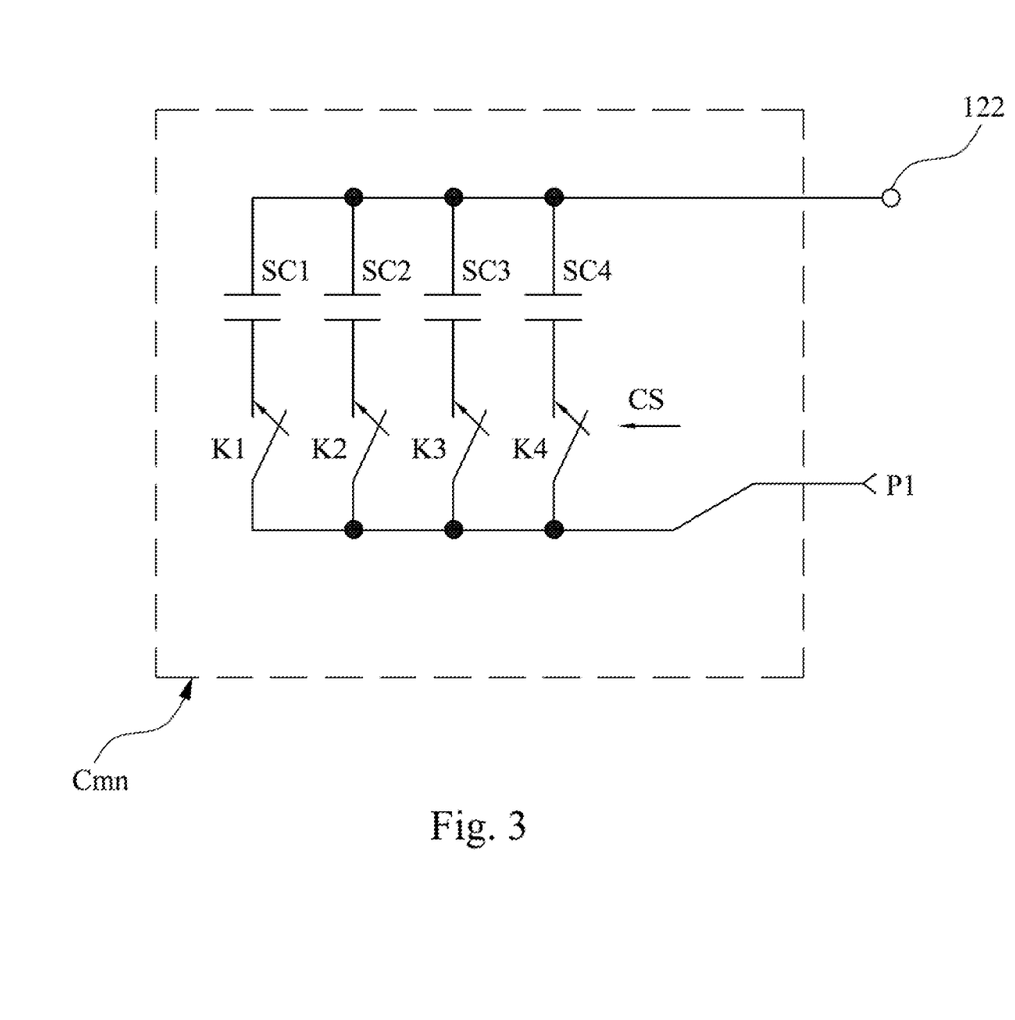
FIG. 3 is a schematic diagram of the variable capacitor unit Cmn as illustrated in FIG. 1, according to one embodiment of the present disclosure.

FIG. 3 is a schematic diagram of the variable capacitor unit Cmn as illustrated in FIG. 1, according to one embodiment of the present disclosure. As illustrated in FIG. 1 and FIG. 3, the variable capacitor unit Cmn includes a plurality of switchable capacitors (e.g., switchable capacitors SC1, SC2, SC3 and SC4), and the switchable capacitors SC1, SC2, SC3 and SC4 are coupled in parallel with each other, in which one terminals of the switchable capacitors SC1, SC2, SC3 and SC4 are configured to selectively receive the driving signal P1, and the other terminals of the switchable capacitors SC1, SC2, SC3 and SC4 are coupled to the first comparator input 122.

In some embodiments, when the controller 140 outputs the control signal CS to the variable capacitor unit Cmn, switches K1, K2, K3 and K4 corresponding to the switchable capacitors SC1, SC2, SC3 and SC4, respectively, can be separately switched on or off, such that the switchable capacitors SC1, SC2, SC3 and SC4 are separately activated or deactivated, and the equivalent capacitance of the variable capacitor unit Cmn can be correspondingly adjusted according to the control signal CS.

For the aforementioned embodiments, applying the sensing device 100 in the touch sensing device can achieve very sensitive touch sensing operations with limited circuits (e.g., only one pin connected to the capacitive touch pad TKN is required) and limited capacitors, to save related circuits and capacitors and further reduce layout areas occupied by the circuits and capacitors, such that the size of the touch sensing device can be significantly reduced and manufacturing cost can be significantly decreased.

Figure 4:
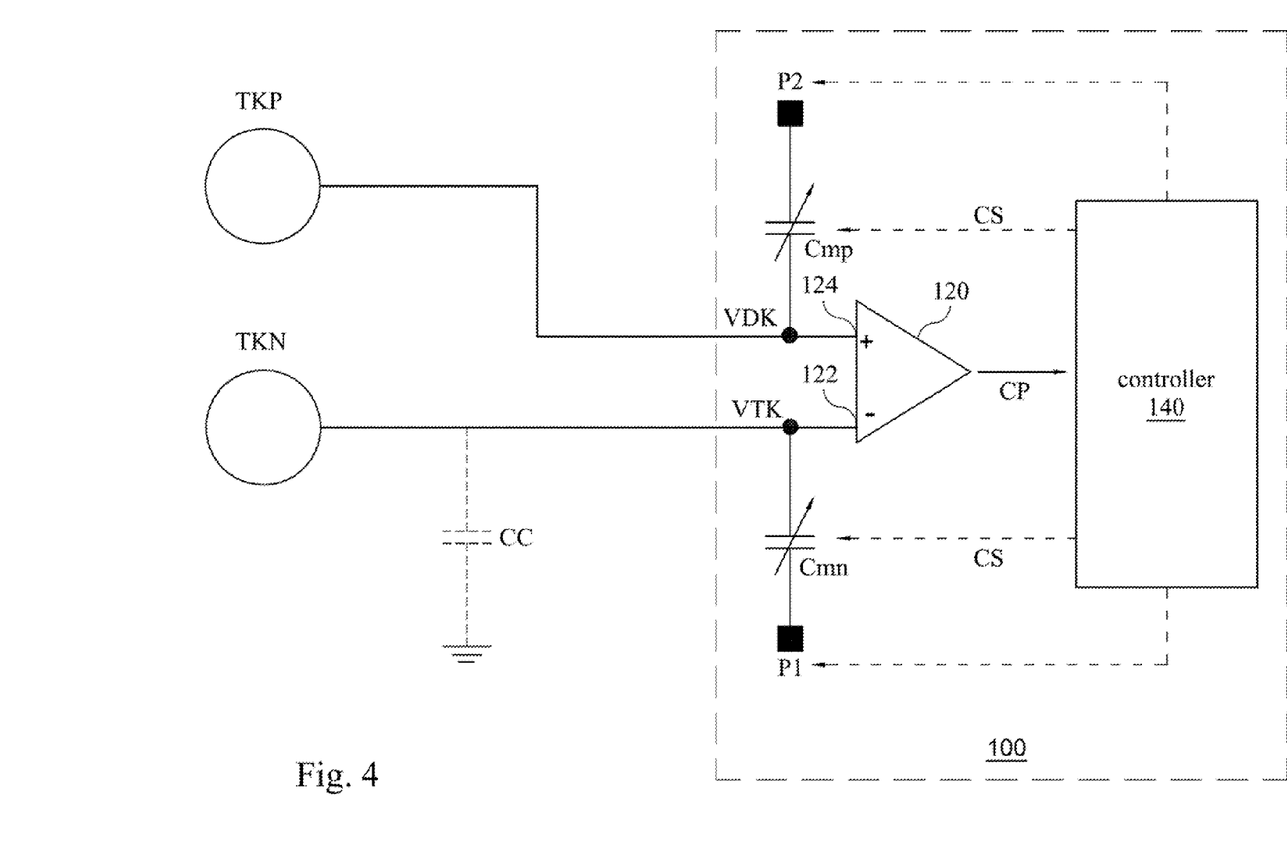
FIG. 4 is a schematic diagram of a sensing device according to a second embodiment of the present disclosure.

FIG. 4 is a schematic diagram of a sensing device according to a second embodiment of the present disclosure, in which the sensing device 100 can be configured to sense multiple touch pads. Compared to FIG. 1, the second comparator input 124 of the sensing device 100 shown in FIG. 4 is further configured to be electrically coupled to another capacitive touch pad TKP. In a condition of the capacitive touch pad TKP being operated (e.g., the capacitive touch pad TKP is touched by a finger, a touch pen, etc., to have capacitance variations), the second potential VDK of the capacitive touch pad TKP can be lower than the first potential VTK. The variable capacitor unit Cmp can be adjusted according to the comparator output signal CP, to perform potential compensation for the second comparator input 124, such that the second potential VDK is equal to or balanced with the first potential VTK after the potential compensation, so as to acquire potential or capacitance variations corresponding to operations of the capacitive touch pad TKP, for sequential data processing, in order to determine if a touch operation occurs or a corresponding touch function is performed.

Figure 5A:
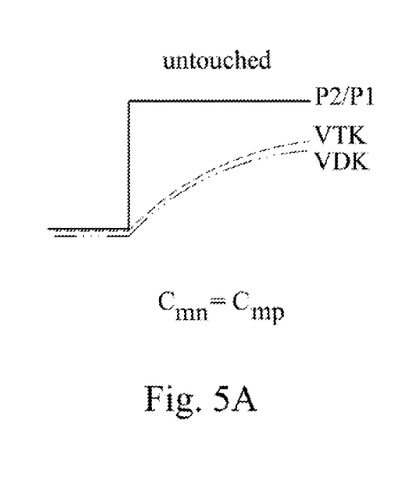
FIGS. 5A-5C are schematic diagrams of capacitance and potential variations in the sensing device shown in FIG. 4, according to one embodiment of the present disclosure.
Figure 5B:
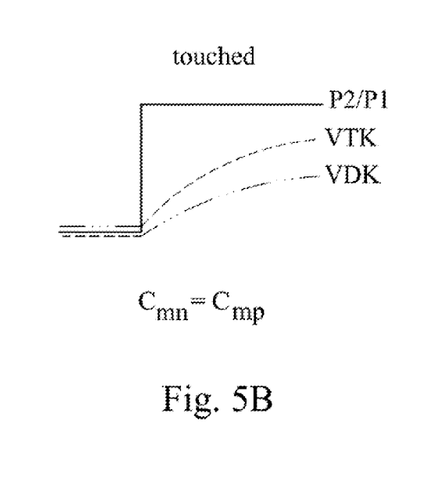
Figure 5C:
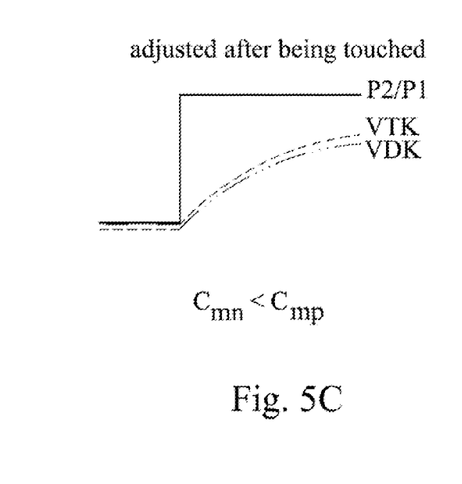

FIGS. 5A-5C are schematic diagrams of capacitance and potential variations in the sensing device shown in FIG. 4, according to one embodiment of the present disclosure. Specifically, as illustrated in FIG. 4 and FIGS. 5A-5C, for example that the variable capacitor units Cmn and Cmp have the same predetermined equivalent capacitance, in the condition of the capacitive touch pad TKP being not operated (e.g., the capacitive touch pad TKP is not touched), the first potential VTK and the second potential VDK can be charged through the variable capacitor units Cmn and Cmp, respectively, to be identical or close to each other. Then, in the condition of the capacitive touch pad TKP being operated (e.g., the capacitive touch pad TKP is touched by a finger, a touch pen, etc.), the capacitance (not shown) of the terminal where the capacitive touch pad TKP is coupled to the second comparator input 124 has a variation, such that the second potential VDK is decreased to be lower than the first potential VTK. Moreover, the variable capacitor unit Cmp can be adjusted according to the comparator output signal CP generated by comparing the first potential VTK with the second potential VDK (e.g., the variable capacitor unit Cmp may have an equivalent capacitance larger than that of the variable capacitor unit Cmn after the variable capacitor unit Cmp is adjusted), to perform potential compensation for the second comparator input 124, such that the second potential VDK is increased again to be identical or close to the first potential VTK. The corresponding potential or capacitance variation mentioned above can be provided for sequential data processing, in order to determine if a touch operation occurs or to perform a corresponding touch function. In other embodiments, the variable capacitor unit Cmn can be adjusted according to the comparator output signal CP generated by comparing the first potential VTK with the second potential VDK (e.g., the variable capacitor unit Cmn may have an equivalent capacitance smaller than that of the variable capacitor unit Cmp after the variable capacitor unit Cmn is adjusted), to perform potential compensation for the first comparator input 122, such that the first potential VTK is decreased to be identical or close to the second potential VDK.

In the embodiment illustrated in FIG. 4, which is similar to the embodiment as illustrated in FIG. 1, the controller 140 can generate the control signal CS to selectively control the variable capacitor unit Cmn and/or the variable capacitor unit Cmp, or, furthermore, to adjust the equivalent capacitance of the variable capacitor unit Cmn and/or the variable capacitor unit Cmp selectively.

In other words, in the embodiment illustrated in FIG. 1 or FIG. 4, the controller 140 can further control the variable capacitor unit Cmn and/or the variable capacitor unit Cmp, to adjust the equivalent capacitance of the variable capacitor unit Cmn and/or the variable capacitor unit Cmp, such that the variable capacitor unit Cmn and/or the variable capacitor unit Cmp can correspondingly perform potential compensation for the second comparator input 124 and/or the first comparator input 122.

Figure 6:
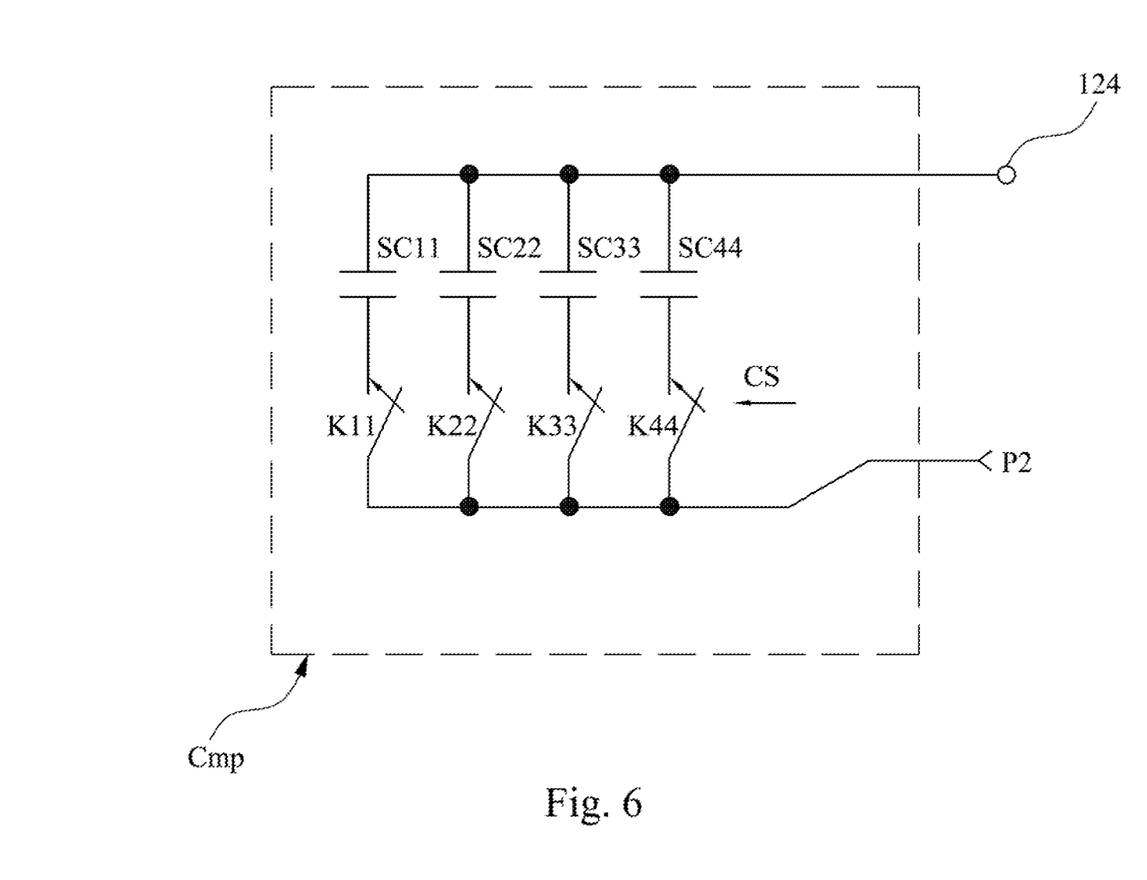
FIG. 6 is a schematic diagram of the variable capacitor unit Cmp as illustrated in FIG. 1 or FIG. 4, according to one embodiment of the present disclosure.

FIG. 6 is a schematic diagram of the variable capacitor unit Crmp as illustrated in FIG. 1 or FIG. 4, according to one embodiment of the present disclosure (in which the variable capacitor unit Cmn can be configured as shown in FIG. 3, and thus it is not illustrated). Similarly, the variable capacitor unit Cmp includes a plurality of switchable capacitors (e.g., switchable capacitors SC11, SC22, SC33 and SC44), and the switchable capacitors SC11, SC22, SC33 and SC44 are coupled in parallel with each other, in which one terminals of the switchable capacitors SC11, SC22, SC33 and SC44 are configured to selectively receive the driving signal P2, and the other terminals of the switchable capacitors SC11, SC22, SC33 and SC44 are coupled to the second comparator input 124.

In some embodiments, when the controller 140 outputs the control signal CS to the variable capacitor unit Cmp, switches K11, K22, K33 and K44 corresponding to the switchable capacitors SC11, SC22, SC33 and SC44, respectively, can be separately switched on or off, such that the switchable capacitors SC11, SC22, SC33 and SC44 are separately activated or deactivated, and the equivalent capacitance of the variable capacitor unit Cmp can be correspondingly adjusted according to the control signal CS.

In some embodiments, the driving signals P1 and P2 can be the same signal or different signals, and can be generated by the controller 140. In practice, levels of the driving signals P1 and P2 can be adjusted by a programmable device or an amplifying device, such that the variable capacitor unit can correspondingly perform potential compensation for the first comparator input 122 or the second comparator input 124 according to the driving signal P1' or P2 having an amplified level, or the capacitance required by the variable capacitor units Cmn and Cmp can be decreased by increasing values of the driving signals P1 and P2 (e.g., taking Q=CV for example, in a condition that the charge or potential is constant, when the voltage increases, the capacitance decreases correspondingly).

Figure 7:
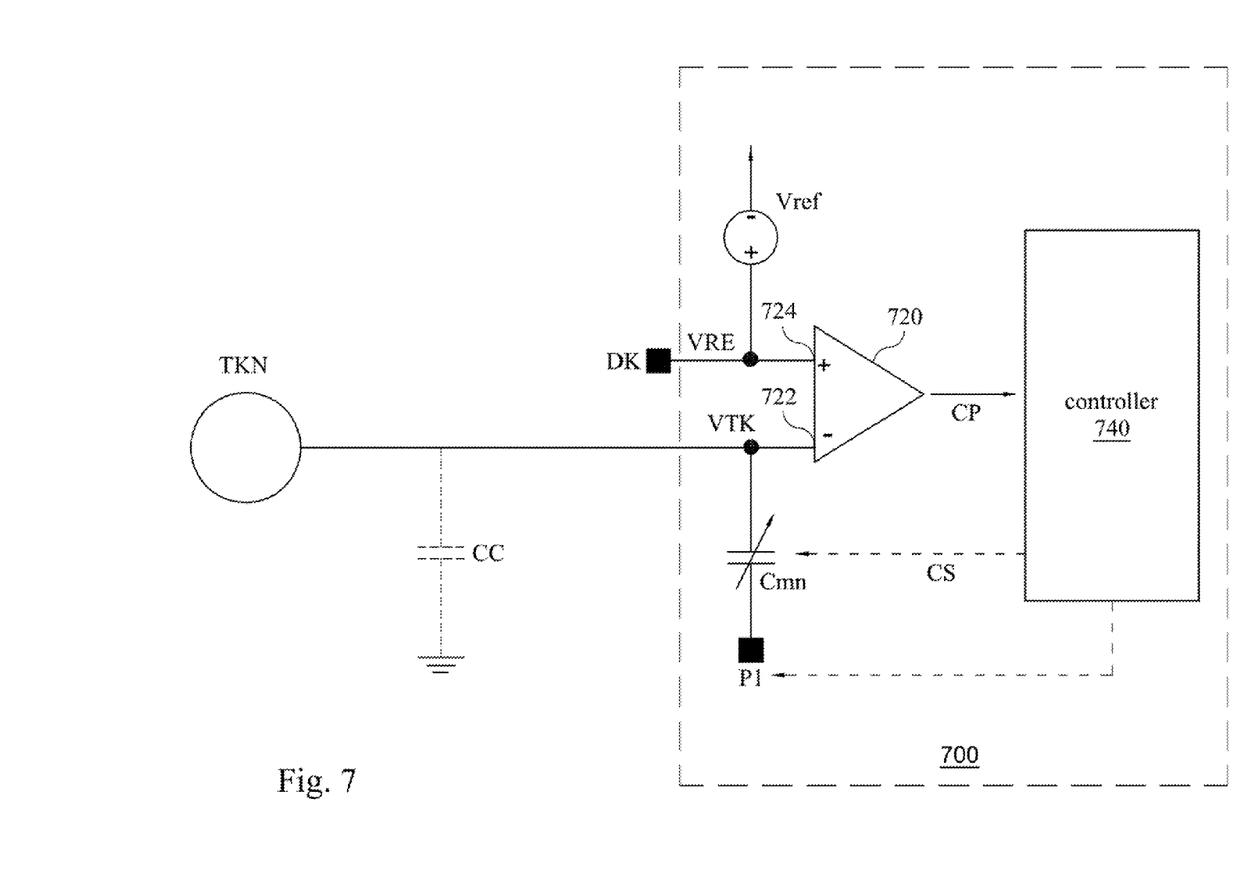
FIG. 7 is a schematic diagram of a sensing device according to a third embodiment of the present disclosure.

FIG. 7 is a schematic diagram of a sensing device according to a third embodiment of the present disclosure. As illustrated in FIG. 7, the sensing device 700 is configured to operations of at least one touch pad (e.g., the capacitive touch pad TKN) and to correspondingly operate (e.g., control sequential circuits, output digital data signals, etc.) according to the sensing result, so as to perform corresponding functions or operations. The sensing device 700 includes a comparator 720 and a variable capacitor unit Cmn. The comparator 720 includes a first comparator input 722 and a second comparator input 724, in which the first comparator input 722 is configured to be electrically coupled to the capacitive touch pad TKN. The second comparator input 724 is configured to be electrically coupled to a reference voltage source Vref to have a reference potential VRE. The variable capacitor unit Cmn is electrically coupled to the first comparator input 722 and is configured to charge the first comparator input 722 with at least one first driving signal (e.g., a driving signal P1), such that the first comparator input 722 has a first potential VTK. The comparator 720 is configured to compare the first potential VTK with the reference potential VRE to generate a comparator output signal CP.

In a condition of the capacitive touch pad TKN being operated (e.g., the capacitive touch pad TKN is touched by a finger, a touch pen, etc., to have capacitance variations), the first potential VTK of the capacitive touch pad TKN is lower than the reference potential VRE. The variable capacitor unit Cmn can be adjusted, according to the comparator output signal CP generated by comparing the first potential VTK with the reference potential VRE, to perform potential compensation for the first comparator input 722, such that the first potential VTK is equal to or balanced with the reference potential VRE after the potential compensation, so as to acquire potential or capacitance variations corresponding to the operations of the capacitive touch pad TKN, for sequential data processing, in order to determine if a touch operation occurs or a corresponding touch function is performed.

In some embodiments, the first comparator input 722 is a positive polarity input (i.e., the input "+") of the comparator 720, and the second comparator input 724 is a negative polarity input (i.e., the input "−") of the comparator 720. In some other embodiments, the first comparator input 722 is the negative polarity input (i.e., the input "−") of the comparator 720, and the second comparator input 724 is the positive polarity input (i.e., the input "+") of the comparator 720.

Furthermore, as illustrated in FIG. 7, the sensing device 700 can further include a controller 740. The controller 740 is electrically coupled to the comparator 720 and configured to receive the comparator output signal CP to generate a control signal CS for controlling the variable capacitor unit Cmn, to adjust the equivalent capacitance of the variable capacitor unit Cmn, such that the variable capacitor unit Cmn can correspondingly perform potential compensation for the first comparator input 722.

Similarly, the variable capacitor unit Cmn can be configured as shown in FIG. 3, and the operations between the controller 740 and the variable capacitor unit Cmn also can be configured as illustrated in the aforementioned embodiments, and thus they are not further detailed herein.

Figure 8:
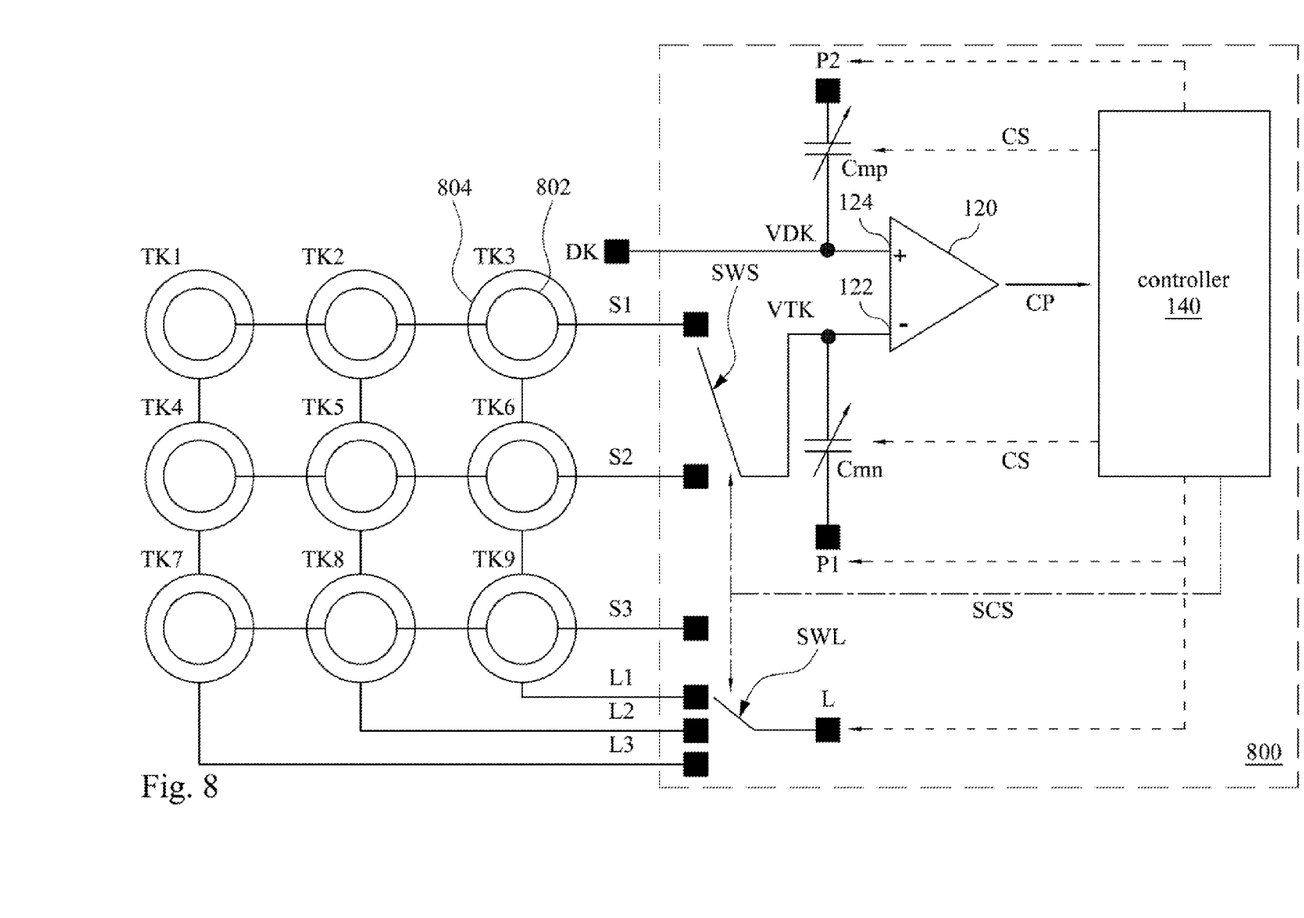
FIG. 8 is a schematic diagram of a sensing device according to a fourth embodiment of the present disclosure.

FIG. 8 is a schematic diagram of a sensing device according to a fourth embodiment of the present disclosure. Compared to the embodiment illustrated in FIG. 1, the sensing device 800 can be configured to be electrically coupled to a plurality of series of touch pads (e.g., a first series of touch pads TK1, TK2 and TK3, a second series of touch pads TK4, TK5 and TK6, a third series of touch pads TK7, TK8 and TK9), and configured to sense operations of the touch pads TK1-TK9, so as to perform corresponding functions or operations.

Taking the embodiment illustrated in FIG. 8 for example, the sensing device 800 can include pins S1-S3 and L1-L3. The first series of touch pads TK1, TK2 and TK3 can be electrically coupled to the pin S1, the second series of touch pads TK4, TK5 and TK6 can be electrically coupled to the pin S2, and the third series of touch pads TK7, TK8 and TK9 can be electrically coupled to the pin S3. Moreover, the touch pads TK3, TK6 and TK9 can be configured to receive signals from the pin L1, the touch pads TK2, TK5 and TK8 can be configured to receive signals from the pin L2, and the touch pads TK1, TK4 and TK7 can be configured to receive signals from the pin L3.

In some embodiments, each one of the touch pads TK1-TK9 can include two electrodes, and the two electrodes are electrically coupled to one of the pins S1-S3 and one of the pins L1-L3, respectively. Taking the touch pad TK3 for example, the touch pad TK3 can include electrodes 802 and 804, in which the electrode 802 is electrically coupled to the pin S1, and the electrode 804 is electrically coupled to the pin L1. Furthermore, the electrode (e.g., the electrode 802) coupled to one pin (e.g., the pin S1) is not coupled to or overlapped with the other electrode (e.g., the electrode 804) coupled to the other pin; in other words, the electrodes coupled to two pins are independent from each other.

In practice, the electrodes 802 and 804 can be fabricated in a same layer or different layers, and at least one dielectric layer can be disposed between the electrodes 802 and 804, such that the electrodes 802 and 804 may operate separately. Moreover, although sizes of the electrodes 802 and 804 are different in FIG. 8, they are given for illustrative purposes but not limiting of the present disclosure. The aforementioned dielectric layer can be made of dielectric material or air, such that the electrodes 802 and 804 form a capacitor having a capacitance.

For example, if each touch pad is formed by a layer of upper electrode and a layer of bottom electrode, the upper electrodes of the first series of touch pads TK1, TK2 and TK3 can be electrically coupled to the pin S1, the upper electrodes of the second series of touch pads TK4, TK5 and TK6 can be electrically coupled to the pin S2, and the upper electrodes of the third series of touch pads TK7, TK8 and TK9 can be electrically coupled to the pin S3. The bottom electrodes of the touch pads TK3, TK6 and TK9 can be electrically coupled to the pin L1 and receive signals from the pin L1. The bottom electrodes of the touch pads TK2, TK5 and TK8 can be electrically coupled to the pin L2 and receive signals from the pin L2. The bottom electrodes of the touch pads TK1, TK4 and TK7 can be electrically coupled to the pin L3 and receive signals from the pin L3.

If two electrodes of the touch pad are fabricated in a same layer (e.g., an inner ring is a first electrode, an outer ring is a second electrode, and a dielectric layer is disposed between the first electrode and the second electrode), for example, the first electrodes of the touch pads TK1, TK2 and TK3 can be electrically coupled to the pin S1 (the other series of touch pads can be electrically coupled to the pins S2 and S3, respectively), and configured in a way similar to, for example, crossing over the outer loop electrode when conductive lines are coupled, to avoid causing short circuit. Similarly, the second electrodes (e.g., the outer loop electrodes) of the touch pads TK3, TK6 and TK9 can be electrically coupled to the pin L1 and receive signals from the pin L1 (in which the second electrodes of the other series of touch pads can be electrically coupled to the pins L2 and L3, respectively).

Compared to the embodiment illustrated in FIG. 1, the sensing device 800 can further include switches SWS and SWL. The switch SWS is configured to selectively couple the first comparator input 122 to the pin S1, S2 or S3, such that the first comparator input 122 can be coupled to a series of corresponding touch pads. In addition, the switch SWL is selectively coupled to the pin L1, L2 or L3, such that a driving signal L is selectively transmitted through the switch SWL to one touch pad in the series of corresponding touch pads. In one embodiment, a level of the driving signal L can be similar to the level of the driving signal P1 illustrated in FIGS. 2A-2C.

In operation, for example, in the condition of the switch SWS coupling the first comparator input 122 to the pin S1 and the switch SWL being coupled to the pin L1, the touch pad TK3 receives the driving signal L through the switch SWL. At the moment, if the touch pad TK3 is accordingly operated (e.g., the touch pad TK3 is touched by a finger, a touch pen, etc., to have capacitance variations), the corresponding operations between the touch pad TK3 and the sensing device 800 are similar to those between the touch pad TKN and the sensing device 100 in FIG. 1, e.g., the capacitance and potential variations in the sensing device 100 as illustrated in FIGS. 2A-2C, and thus they are not further detailed herein.

As can be known from the embodiment illustrated in FIG. 8, the sensing device 800 can be coupled to multiple touch pads by a certain amount of pins and perform corresponding operations. For example in FIG. 8, the touch pads TK1-TK9 only requires pins S1-S3, L1-L3 and DK. As a result, arrangements of pins in the sensing device can be decreased, to further save manufacturing cost.

Notably, the number of the aforementioned touch pads and pins are given for illustrative purposes but not limiting of the present disclosure, and thus, it is intended to cover various modifications and similar arrangements included within the spirit and scope of the appended claims, as is understood by one of ordinary skill in the art. For example, one of ordinary skill in the art may arrange a touch pad array having 4×4 touch pads and arrange 4+4+1=9 pins for the sensing device.

Furthermore, compared to the embodiment illustrated in FIG. 1, the controller 140 can further be configured to output a switch control signal SCS for controlling the switches SWS and SWL. In some embodiments, the controller 140 can be configured to output the switch control signal SCS for controlling the switch SWS to rapidly switch between the pins S1-S3, and for controlling the switch SWL to rapidly switch between the pins L1-L3, such that the sensing device 800 can rapidly sense the operations of the aforementioned touch pads, so as to perform corresponding functions or operations. In other embodiments, the controller 140 can be configured to output different switch control signals for controlling the switches SWS and SWL, respectively, and thus the present disclosure is not limited to that illustrated in FIG. 8.

Moreover, compared to the embodiment illustrated in FIG. 1, the controller 140 can further be configured to output the driving signal L and transmit the driving signal L through the switch SWL to the corresponding touch pad(s).

Figure 9:
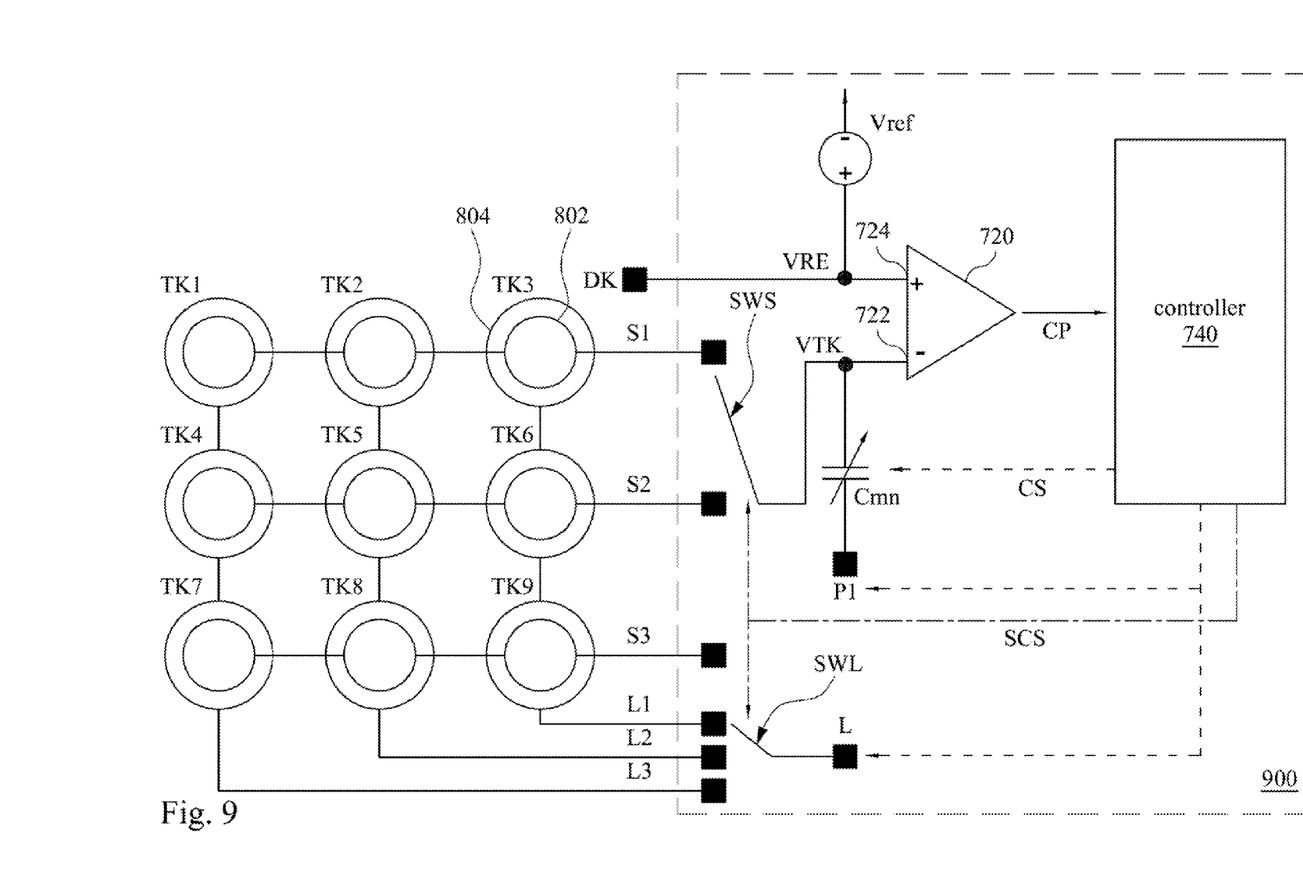
FIG. 9 is a schematic diagram of a sensing device according to a fifth embodiment of the present disclosure.

FIG. 9 is a schematic diagram of a sensing device according to a fifth embodiment of the present disclosure. Compared to the embodiment illustrated in FIG. 7, the sensing device 900 can be configured to be electrically coupled to a plurality of series of touch pads (e.g., a first series of touch pads TK1, TK2 and TK3, a second series of touch pads TK4, TK5 and TK6, a third series of touch pads TK7, TKB and TK9), and configured to sense operations of the touch pads TK1-TK9, so as to perform corresponding functions or operations. Similarly, the sensing device 900 can include pins S1-S3 and L1-L3. The connections and operations of the touch pads TK1-TK9 with the pins S1-S3 and L1-L3 are similar to those as mentioned above, and thus they not further detailed herein. Furthermore, the sensing device 900 can further include the switches SWS and SWL, in which operations of the switches SWS and SWL are similar to those as mentioned above, and thus they are not further detailed herein.

In operation, for example, in the condition of the switch SWS coupling the first comparator input 722 to the pin S1 and the switch SWL being coupled to the pin L1, the touch pad TK3 receives the driving signal L through the switch SWL. At the moment, if the touch pad TK3 is accordingly operated (e.g., the touch pad TK3 is touched by a finger, a touch pen, etc., to have capacitance variations), the corresponding operations between the touch pad TK3 and the sensing device 900 are similar to those between the touch pad TKN and the sensing device 700 in FIG. 7, and thus they are not further detailed herein.

Compared to the embodiment illustrated in FIG. 7, the controller 740 can further be configured to output the switch control signal SCS for controlling the switches SWS and SWL. In some embodiments, the controller 740 can be configured to output the switch control signal SCS for controlling the switch SWS to rapidly switch between the pins S1-S3, and for controlling the switch SWL to rapidly switch between the pins L1-L3, such that the sensing device 900 can rapidly sense the operations of the aforementioned touch pads, so as to perform corresponding functions or operations. In other embodiments, the controller 740 can be configured to output different switch control signals for controlling the switches SWS and SWL, respectively, and thus the present disclosure is not limited to that illustrated in FIG. 9.

In addition, compared to the embodiment illustrated in FIG. 7, the controller 740 can further be configured to output the driving signal L and transmit the driving signal L through the switch SWL to the corresponding touch pad(s).

In practice, the sensing device in the aforementioned embodiments can be individually disposed or integrated into a signal processing circuit (e.g., an analog-to-digital converter circuit). The aforementioned driving signals can be various types of signals such as pulse signals, voltage signals, etc., and can be generated by a controller (e.g., a micro-controller, MCU) to be dynamically adjusted, in which the levels of the aforementioned driving signals also can be adjusted by a programmable device or an amplifying device, and thus they are not limited to those as mentioned above.

For the aforementioned embodiments compared to conventional art, the sensing device in the embodiments of the present disclosure can perform very sensitive touch sensing operations by limited circuits (e.g., pins connected to a capacitive touch pad) and limited capacitors, to save related circuits and capacitors and further reduce layout areas occupied by the circuits and capacitors, such that the size of the touch sensing device can be significantly reduced and manufacturing cost can be significantly decreased.

As is understood by one of ordinary skill in the art, the foregoing embodiments of the present disclosure are illustrative of the present disclosure rather than limiting of the present disclosure, it is intended to cover various modifications and similar arrangements included within the spirit and scope of the appended claims, the scope of which should be accorded with the broadest interpretation so as to encompass all such modifications and similar structures.

What is claimed is:

1. A sensing device comprising:
   a comparator comprising a first comparator input and a second comparator input, the first comparator input configured to be electrically coupled to a first touch pad;
   a first variable capacitor unit electrically coupled to the first comparator input, the first variable capacitor unit configured to charge the first comparator input with at least one first driving signal, such that the first comparator input has a first potential;
   a second variable capacitor unit electrically coupled to the second comparator input, the second variable capacitor unit configured to charge the second comparator input with at least one second driving signal, such that the second comparator input has a second potential; and
   a controller configured to receive the comparator output signal to generate a control signal for controlling the first variable capacitor unit to adjust an equivalent capacitance of the first variable capacitor unit, controlling the second variable capacitor unit to adjust an equivalent capacitance of the second variable capacitor unit, or a combination thereof;
   wherein the comparator is configured to compare the first potential with the second potential to generate a comparator output signal;
   wherein in a condition of the first touch pad being touched, the first potential is decreased to be lower than the second potential, and then the controller performs one of the following operations:
      adjusting the equivalent capacitance of the first variable capacitor unit to be larger than the equivalent capacitance of the second variable capacitor unit according to the comparator output signal to perform potential compensation for the first comparator input;
      adjusting the equivalent capacitance of the second variable capacitor unit to be smaller than the equivalent capacitance of the first variable capacitor unit according to the comparator output signal to perform potential compensation for the second comparator input; and
      adjusting the equivalent capacitance of each of the first and second variable capacitor units, such that the equivalent capacitance of the second variable capacitor unit is smaller than the equivalent capacitance of the first variable capacitor unit according to the comparator output signal to perform potential compensation for the first and second comparator inputs;
   wherein variations of the equivalent capacitances of the first and second variable capacitor units or variations of the first and second potentials are provided to determine if a touch operation occurs.

2. The sensing device as claimed in claim 1, wherein the first variable capacitor unit comprises:

a plurality of switchable capacitors, the switchable capacitors coupled in parallel with each other, wherein one terminals of the switchable capacitors are configured to selectively receive the at least one first driving signal, and the other terminals of the switchable capacitors are coupled to the first comparator input.

3. The sensing device as claimed in claim 1,
wherein the first variable capacitor unit comprises a plurality of switchable capacitors, the switchable capacitors are coupled in parallel with each other to the first comparator input, and the switchable capacitors are selectively activated and deactivated, respectively, according to the control signal.

4. The sensing device as claimed in claim 1, further comprising:
a first switch configured to selectively couple the first comparator input to a series of touch pads in a plurality of series of touch pads, the series of touch pads comprising the first touch pad; and
a second switch configured to selectively transmit at least one third driving signal to the first touch pad in the series of touch pads;
wherein the controller is configured to output at least one switch control signal for controlling the first switch and the second switch.

5. The sensing device as claimed in claim 4, wherein the controller is further configured to:
receive the comparator output signal to adjust an equivalent capacitance of the first variable capacitor unit; and
output the at least one first driving signal, the at least one second driving signal, the at least one third driving signal, or the combination thereof.

6. The sensing device as claimed in claim 4, wherein the first variable capacitor unit comprises:
a plurality of switchable capacitors, the switchable capacitors coupled in parallel with each other, wherein one terminals of the switchable capacitors are configured to selectively receive the at least one first driving signal, and the other terminals of the switchable capacitors are coupled to the first comparator input.

7. A sensing device comprising:
a comparator comprising a first comparator input and a second comparator input, the first comparator input configured to be electrically coupled to a touch pad, the second comparator input configured to be electrically coupled to a reference voltage source to have a reference potential;
a variable capacitor unit electrically coupled to the first comparator input, the first variable capacitor unit configured to charge the first comparator input with at least one first driving signal, such that the first comparator input has a first potential, wherein the comparator is configured to compare the first potential with the reference potential to generate a comparator output signal; and
a controller configured to receive the comparator output signal to generate a control signal for controlling the variable capacitor unit, to adjust an equivalent capacitance of the variable capacitor unit;
wherein in a condition of the touch pad being touched, the first potential is decreased to be lower than the reference potential, and then the controller adjusts the equivalent capacitance of the variable capacitor unit higher according to the comparator output signal to perform potential compensation for the first comparator input;
wherein variations of the equivalent capacitance of the variable capacitor unit or variations of the first potential are provided to determine if a touch operation occurs.

8. The sensing device as claimed in claim 7, wherein the variable capacitor unit comprises:
a plurality of switchable capacitors, the switchable capacitors coupled in parallel with each other, wherein one terminals of the switchable capacitors are configured to selectively receive the at least one first driving signal, and the other terminals of the switchable capacitors are coupled to the first comparator input.

9. The sensing device as claimed in claim 7,
wherein the variable capacitor unit comprises a plurality of switchable capacitors, the switchable capacitors are coupled in parallel with each other to the first comparator input, and the switchable capacitors are selectively activated and deactivated, respectively, according to the control signal.

10. The sensing device as claimed in claim 7, further comprising:
a first switch configured to selectively couple the first comparator input to a series of touch pads in a plurality of series of touch pads, the series of touch pads comprising the touch pad; and
a second switch configured to selectively transmit at least one second driving signal to the touch pad in the series of touch pads;
wherein the controller is configured to output at least one switch control signal for controlling the first switch and the second switch.

11. The sensing device as claimed in claim 10, wherein the controller is further configured to:
receive the comparator output signal to adjust an equivalent capacitance of the variable capacitor unit; and
output the at least one first driving signal, the at least one second driving signal, or the combination thereof.

12. The sensing device as claimed in claim 10, wherein the variable capacitor unit comprises:
a plurality of switchable capacitors, the switchable capacitors coupled in parallel with each other, wherein one terminals of the switchable capacitors are configured to selectively receive the at least one first driving signal, and the other terminals of the switchable capacitors are coupled to the first comparator input.

13. A sensing device comprising:
a comparator comprising a first comparator input and a second comparator input, the first comparator input configured to be electrically coupled to a first touch pad, and the second comparator input configured to be electrically coupled to a second touch pad;
a first variable capacitor unit electrically coupled to the first comparator input, the first variable capacitor unit configured to charge the first comparator input with at least one first driving signal, such that the first comparator input has a first potential;
a second variable capacitor unit electrically coupled to the second comparator input, the second variable capacitor unit configured to charge the second comparator input with at least one second driving signal, such that the second comparator input has a second potential; and
a controller configured to receive the comparator output signal to generate a control signal for controlling the first variable capacitor unit to adjust an equivalent capacitance of the first variable capacitor unit, controlling the second variable capacitor unit to adjust an equivalent capacitance of the second variable capacitor unit, or a combination thereof;

wherein the comparator is configured to compare the first potential with the second potential to generate a comparator output signal;

wherein in a condition of the first touch pad being touched, the first potential is decreased to be lower than the second potential, and then the controller performs one of the following operations:

adjusting the equivalent capacitance of the first variable capacitor unit to be larger than the equivalent capacitance of the second variable capacitor unit according to the comparator output signal to perform potential compensation for the first comparator input;

adjusting the equivalent capacitance of the second variable capacitor unit to be smaller than the equivalent capacitance of the first variable capacitor unit according to the comparator output signal to perform potential compensation for the second comparator input; and adjusting the equivalent capacitance of each of the first and second variable capacitor units, such that the equivalent capacitance of the second variable capacitor unit is smaller than the equivalent capacitance of the first variable capacitor unit according to the comparator output signal to perform potential compensation for the first and second comparator inputs;

wherein in a condition of the second touch pad being touched, the second potential is decreased to be lower than the first potential, and then the controller performs one of the following operations:

adjusting the equivalent capacitance of the second variable capacitor unit to be larger than the equivalent capacitance of the first variable capacitor unit according to the comparator output signal to perform potential compensation for the second comparator input;

adjusting the equivalent capacitance of the first variable capacitor unit to be smaller than the equivalent capacitance of the second variable capacitor unit according to the comparator output signal to perform potential compensation for the first comparator input; and adjusting the equivalent capacitance of each of the first and second variable capacitor units, such that the equivalent capacitance of the first variable capacitor unit is smaller than the equivalent capacitance of the second variable capacitor unit according to the comparator output signal to perform potential compensation for the first and second comparator inputs;

wherein variations of the equivalent capacitances of the first and second variable capacitor units or variations of the first and second potentials are provided to determine if a touch operation occurs.

14. The sensing device as claimed in claim 13, wherein the first variable capacitor unit comprises:

a plurality of first switchable capacitors, the first switchable capacitors coupled in parallel with each other, wherein one terminals of the first switchable capacitors are configured to selectively receive the at least one first driving signal, and the other terminals of the first switchable capacitors are coupled to the first comparator input; and wherein the second variable capacitor unit comprises:

a plurality of second switchable capacitors, the second switchable capacitors coupled in parallel with each other, wherein one terminals of the second switchable capacitors are configured to selectively receive the at least one second driving signal, and the other terminals of the second switchable capacitors are coupled to the second comparator input.

15. The sensing device as claimed in claim 14, wherein the first and second switchable capacitors are selectively activated and deactivated, respectively, according to the control signal.

* * * * *